United States Patent
Ozawa

(10) Patent No.: US 7,869,261 B2
(45) Date of Patent: Jan. 11, 2011

(54) SEMICONDUCTOR MEMORY WHICH ENABLES RELIABLE DATA WRITING WITH LOW SUPPLY VOLTAGE BY IMPROVING THE CONDUCTANCE VIA ACCESS TRANSISTORS DURING WRITE OPERATION

(75) Inventor: Takashi Ozawa, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 11/396,511

(22) Filed: Apr. 4, 2006

(65) Prior Publication Data

US 2007/0139996 A1 Jun. 21, 2007

(30) Foreign Application Priority Data

Dec. 20, 2005 (JP) ............................. 2005-367150

(51) Int. Cl.
*G11C 11/00* (2006.01)
(52) U.S. Cl. ..................................... 365/154
(58) Field of Classification Search ............ 365/154 O, 365/189.01, 154, 189.011
See application file for complete search history.

(56) References Cited

U.S. PATENT DOCUMENTS

| | | | | |
|---|---|---|---|---|
| 5,757,702 A | * | 5/1998 | Iwata et al. ............ | 365/189.05 |
| 6,097,651 A | * | 8/2000 | Chan et al. ............ | 365/203 |
| 6,510,076 B1 | * | 1/2003 | Lapadat et al. ........ | 365/154 |
| 6,834,007 B2 | * | 12/2004 | Takemura .............. | 365/154 |
| 7,009,871 B1 | * | 3/2006 | Kawasumi .............. | 365/154 |
| 7,102,915 B2 | * | 9/2006 | Sohn ...................... | 365/154 |

FOREIGN PATENT DOCUMENTS

| | | |
|---|---|---|
| JP | 2003-132684 A | 5/2003 |
| JP | 2005-25863 A | 1/2005 |

* cited by examiner

*Primary Examiner*—VanThu Nguyen
(74) *Attorney, Agent, or Firm*—Arent Fox LLP

(57) ABSTRACT

A semiconductor memory maintains securely the stored contents in the memory cells, and it is written with data reliably even in a case where a relatively low supply voltage is applied. A memory cell M00 comprises a pair of inverters cross-coupled with each other, a first switching unit provided between bit line BL and the output terminal of one of the inverters, and a second switching unit provided between bit line XBL and the output terminal of the other inverter. The first switching unit and the second switching unit are controlled to be conductive such that the conductance of the switches be larger for the writing operation than for the reading operation.

8 Claims, 14 Drawing Sheets

CIRCUIT DIAGRAM SHOWING MEMORY CELL AS FOURTH EMBODIMENT

FUNCTIONAL BLOCK DIAGRAM SHOWING CONSTRUCTION OF SRAM AS EMBODIMENT ACCORDING TO PRESENT INVENTION

FIG. 2 CIRCUITRY BLOCK DIAGRAM SHOWING AN EXAMPLE OF CELL ARRAY

CIRCUIT DIAGRAM SHOWING MEMORY CELL AS FIRST EMBODIMENT

TIMING CHART SHOWING OPERATION OF
MEMORY CELL AS FIRST EMBODIMENT

CIRCUIT DIAGRAM SHOWING MEMORY CELL AS SECOND EMBODIMENT

CIRCUIT DIAGRAM SHOWING MEMORY CELL AS THIRD EMBODIMENT

CIRCUIT DIAGRAM SHOWING MEMORY CELL AS FOURTH EMBODIMENT

CIRCUIT DIAGRAM SHOWING ANOTHER EXAMPLE OF MEMORY CELL AS FOURTH EMBODIMENT

CIRCUIT DIAGRAM SHOWING YET ANOTHER EXAMPLE OF MEMORY CELL AS FOURTH EMBODIMENT

CIRCUIT DIAGRAM SHOWING ANOTHER EXAMPLE OF MEMORY CELL AS FOURTH EMBODIMENT

CIRCUIT DIAGRAM SHOWING MEMORY CELL AS FIFTH EMBODIMENT

FIG. 12 CIRCUIT DIAGRAM SHOWING AN EXAMPLE OF SOURCE-VOLTAGE SWITCHING CIRCUIT

CIRCUIT DIAGRAM SHOWING MEMORY CELL AS SIXTH EMBODIMENT

CIRCUIT DIAGRAM SHOWING PRIOR-ART MEMORY CELL

SEMICONDUCTOR MEMORY WHICH ENABLES RELIABLE DATA WRITING WITH LOW SUPPLY VOLTAGE BY IMPROVING THE CONDUCTANCE VIA ACCESS TRANSISTORS DURING WRITE OPERATION

CROSS-REFERENCE TO RELATED APPLICATIONS

This application is based upon and claims the benefit of priority from each of the prior Japanese Patent Application No. 2005-367150 filed on Dec. 20, 2005, the entire contents of which are incorporated herein by reference.

BACKGROUND OF THE INVENTION

1. Field of the Invention

The present invention relates to a semiconductor memory and particularly to a single port static random-access memory (hereinafter also referred to as "SRAM" in a single word).

2. Description of Related Art

As an example, FIG. 14 is a circuit diagram that shows the design of a memory cell in a conventional Static Random Access Memory (SRAM).

This SRAM memory cell M100 shown in FIG. 14 comprises a latch circuit that includes a p-type MOS transistor P101 and an n-type MOS transistor N101, which are connected with each other in series between a supply voltage VCC and a ground voltage VSS, and another p-type MOS transistor P102 and another n-type MOS transistor N102, which are connected with each other in series between a supply voltage VCC and a ground voltage VSS.

The gate terminals of MOS transistors P101 and N101 are both connected to the junction T102 of MOS transistor P102 and N102, and the gate terminals of MOS transistors P102 and N102 are both connected to the junction T101 of MOS transistors P101 and N101. In other words, because these transistors are cross-coupled in connection, p-type MOS transistors P101 and P102 act as load transistors (load), and n-type MOS transistors N101 and N102 act as drive transistors (driver).

In addition, the SRAM memory cell M100 comprises: an n-type MOS transistor N103, which is connected between one of complementary bit line pair BL and the junction T101; and an n-type MOS transistor N104, which is connected between the other one of the complementary bit line pair XBL and the junction T102. The gates of n-type MOS transistors N103 and N104 are both connected to a common word line WL. Therefore, the gate electrical potentials of n-type MOS transistors N103 and N104 are controlled by the word line WL.

In this arrangement, p-type MOS transistors P101 and P102 act as load, n-type MOS transistors N101 and N102 act as driver, and n-type MOS transistors N103 and N104 act as transfer. As a result, the SRAM memory cell has a CMOS structure.

Now, the operation of the SRAM memory cell M100 is explained.

At first, as an example of reading operation for the SRAM memory cell M100, readout is considered for a case where junction T101 has a low level of electrical potential while junction T102 has a high level in the SRAM memory cell M100.

While the word line WL is at a low level of electrical potential before a reading operation of the SRAM memory cell M100, the supply voltage VCC is applied to bit lines BL and XBL for a predetermined pre-charging time. By this pre-charging, electricity is charged in the lines BL and XBL, the charge being stored up-to the charging capacities CBL and CXBL of the electric wirings. Therefore, after the completion of the pre-charging, the bit lines BL and XBL are kept approximately at the supply voltage VCC.

After the completion of the pre-charging time, a reading operation is executed by turning the word line WL to a high level of electrical potential. As a result, a readout current IR flows through n-type MOS transistor N103 and n-type MOS transistor N101 from bit line BL to the ground voltage VSS, and the electrical potential of the bit line BL is returned to the low level.

When this readout current IR flows, the voltage at junction T101 rises from a low level in correspondence to the ratio of the activated resistances of n-type MOS transistor N101 and n-type MOS transistor N103. By this voltage increase, the inverter comprising p-type MOS transistor P102 and n-type MOS transistor N102 should not be inverted. In other words, the voltage of the junction T101 must be prevented from exceeding a threshold voltage Vth at which the inverter is inverted. Therefore, the conductance of n-type MOS transistor N101 must be set greater than that of n-type MOS transistor N103 (N101>N103).

As the electrical potential of bit line XBL is kept at a high level, the electrical potentials of bit lines BL and XBL are at a low level and at a high level, respectively. This condition is detected by a sense amplifier (not shown), which uses the voltage difference between the bit lines BL and XBL as input, and the stored content of the SRAM memory cell M100 is read out.

Next, an example of writing operation is explained by assuming that junction T101 is at a high level while junction T102 is at a low level in the SRAM memory cell M100 before this writing operation takes place and that this writing operation turns junction T101 to a low level and junction T102 to a high level.

At first, by write-in amplifiers (not shown), a low level electrical potential is applied to bit line BL while a high level electrical potential is applied to bit line XBL. In addition, a high level electrical potential is applied to the word line WL. As a result, n-type MOS transistors N103 and N104 become conductive in the SRAM memory cell M100, and a write-in current IW flows through p-type MOS transistor P101 and n-type MOS transistor N103 from the supply voltage VCC to bit line BL.

When this write-in current IW flows, the voltage at junction T101 drops from the high level in correspondence to the ratio of the activated resistances of p-type MOS transistor P101 and n-type MOS transistor N103. Here, the inverter comprising p-type MOS transistor P102 and n-type MOS transistor N102 should be inverted. In other words, the voltage at junction T101 should drop beyond the threshold voltage Vth, at which the inverter is inverted. Therefore, the conductance of p-type MOS transistor P101 must be set smaller than that of n-type MOS transistor N103 (N103>P101).

When the voltage at junction T101 becomes lower than the threshold voltage Vth, the voltage at junction T102 is turned from the low level to the high level. As a result, the output of the inverter comprising p-type MOS transistor P101 and n-type MOS transistor N101 is turned from the high level to the low level, and the writing operation for the SRAM memory cell M100 completes.

As technologies relating to SRAM, Japanese Unexamined Patent Publication Nos. 2005-25863 and 2003-132684 disclose multi-port SRAMs.

SUMMARY OF THE INVENTION

SRAM memory cell M100 satisfies relation n-type MOS transistor N101>p-type MOS transistor P101 in conductance on condition that n-type MOS transistor N101>n-type MOS transistor N103 in conductance for a reading operation and that n-type MOS transistor N103>p-type MOS transistor P101 in conductance for a writing operation. In this condition in conductance, the threshold voltage Vth of the inverter that comprises n-type MOS transistor N101 and p-type MOS transistor P101 is lower than a half of the supply voltage (Vth<½ VCC).

However, as the supply voltage becomes lower, for example, because of a recent trend in this field of lowering the supply voltage applied to a semiconductor memory, the threshold voltage Vth of the inverter in SRAM memory cell M100 also becomes lower in correspondence with the decreased supply voltage. If this threshold voltage Vth come to be lower than a static noise level, then the inverter of the memory cells can be inverted by a static noise. This presents a possibility that the contents stored in the memory cells may become corrupted. To avoid such corruption, it is important to raise the threshold voltage Vth for maintenance of the contents stored in the memory cells. For example, if n-type MOS transistor N101 substantially equals p-type MOS transistor P101 in conductance, then the threshold voltage Vth can be raised. However, condition n-type MOS transistor N103>p-type MOS transistor P101 in conductance for writing operation may not be satisfied because of the uneven quality of semiconductor memories as products. If this condition is not satisfied, then it is a problem because the writing operation will not be reliable.

The present invention is to solve the above problem of the prior art by providing a semiconductor memory that maintains securely the contents stored in the memory cells and that enables reliable writing in the memory cells even with a low supply voltage.

In order to solve the problem, it is preferable to provide a semiconductor memory comprising a plurality of memory cells, which are disposed in a matrix, and a pair of bit lines, which are disposed for each column of the memory cells;

each of the memory cells comprising:

a pair of inverters, which are cross-coupled and each of whose output terminals is connected through a path to a corresponding one of the bit lines;

a first switching unit, which is provided between one of the bit lines and the output terminal of a corresponding one of the inverters; and a second switching unit, which is provided between the other of the bit lines and the output terminal of the other of the inverters;

wherein:

each of the first switching unit and the second switching unit is controlled to be conductive such that the conductance of each switching unit be larger for a writing operation than for a reading operation.

Furthermore, it is preferable to provide a method for controlling a semiconductor memory that comprises a plurality of memory cells, which are disposed in a matrix, and a pair of bit lines, which are disposed for each column of the memory cells, each of the memory cells comprising a pair of inverters, which are cross-coupled and each of whose output terminals is connected through a path to a corresponding one of the bit lines; wherein:

the method comprises:

a step for making the path between each of the bit lines and the output terminal of a corresponding one of the inverters conductive at a first conductance for a reading operation; and a step for making the path between each of the bit lines and the output terminal of a corresponding one of the inverters conductive at a second conductance for a writing operation, the second conductance being higher than the first conductance.

By this, for the writing operation, the conductance of the path between the bit line and the inverter is made larger than that between the output terminal of the inverter and the ground voltage. As a result, the inversion to the low level is achieved easily. For the inverter, the ratio in conductance of the transistors disposed on the supply-voltage side and on the ground-voltage side is determined to set the threshold voltage, at which the output of the inverter is turned over, to an approximately half of the supply voltage. In this way, the semiconductor memory is made reliable for maintaining the contents stored in the memory cells as well as for writing data into the memory cells.

As another means for solving the problem, it is preferable to provide a semiconductor memory comprising a plurality of memory cells, which are disposed in a matrix, and a plurality of pairs of bit lines, which are disposed with respect to the columns of the memory cells;

each of the memory cells comprising:

a pair of inverters, which are cross-coupled and each of whose output terminals is connected through a path to a corresponding one of the bit lines; and a power-source switch, which is provided on a path from a supply voltage through each of the inverters to a ground voltage;

wherein:

the power-source switch is turned non-conductive for a writing operation.

In addition, it is preferable to provide a method for controlling a semiconductor memory that comprises a plurality of memory cells disposed in a matrix and a plurality of pairs of bit lines disposed with respect to the columns of the memory cells, each of the memory cells comprising a pair of inverters, which are cross-coupled and each of whose output terminals is connected through a path to a corresponding one of the bit lines; wherein:

the method comprises:

a step for terminating supply of power to the inverters for a writing operation; and a step for providing power to the inverters for operations other than the writing operation.

By this, for the writing operation, the output power on the low level side or the high level side of the latch circuit, which comprises the cross-coupled inverters, becomes comparatively lower. As a result, the level on the side where the output power has decreased is easily turned over. For the inverter, the ratio in conductance of the transistors disposed on the supply-voltage side and on the ground-voltage side is determined to set the threshold voltage, at which the output of the inverter is turned over, to an approximately half of the supply voltage. In this way, the semiconductor memory is made reliable for maintaining the contents stored in the memory cells as well as for writing data into the memory cells.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Now, semiconductor memories as embodiments according to the present invention are described in reference to FIG. 1 to FIG. 13, which illustrate specific examples.

Figure 1:
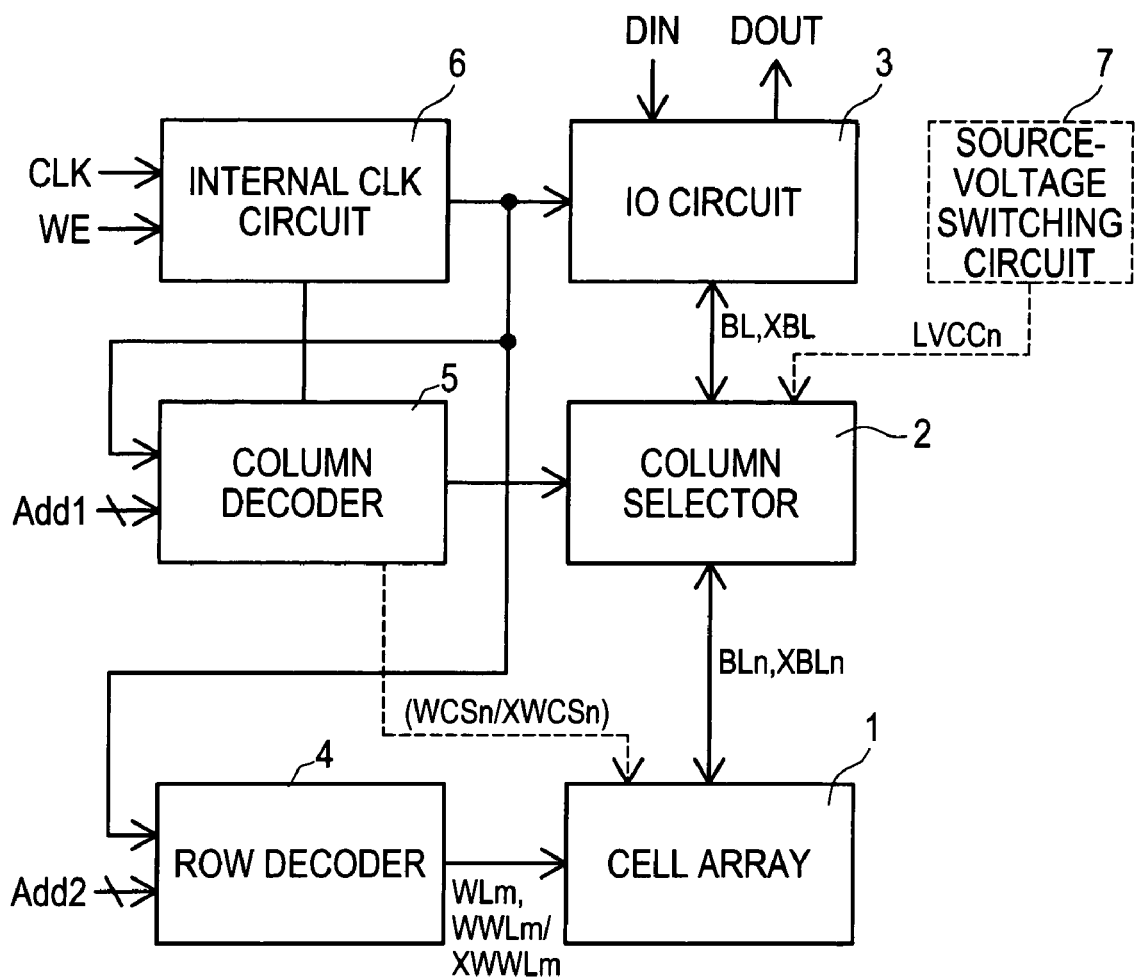
FIG. 1 is a functional block diagram showing the construction of an SRAM as an embodiment according to the present invention.

FIG. 1 is a functional block diagram showing the construction of a single port Static Random Access Memory (SRAM) as an embodiment according to the present invention. The SRAM comprises a memory cell array 1, a column selector 2 that selects a pair of bit lines BLn and XBLn from a plurality of bit lines extending from the memory cell array 1 for the output from the bit lines BL and XBL, an IO circuit 3, that is connected to the bit lines BL and XBL extending from the column selector 2, a row decoder 4 that outputs signals for selecting the word line WLm and the write word line WWLm or XWWLm in the memory cell array 1, a column decoder 5 that outputs selection signals to the column selector 2, and an internal CLK circuit 6 that generates an internal clock signal on the basis of an external clock signal CLK and a write-enable signal WE, which is received as inputs.

In the memory cell array 1, a plurality of memory cells are arranged in a matrix, and power-supply terminals and signal terminals are provided at the positions where electrical connections to power-supply lines and various signal lines are arranged for the cells, which are adjacent to one another. Because the memory cells are arranged in a matrix, the electric wiring for the whole memory cell array 1 is achieved in a relatively simple manner.

Figure 2:
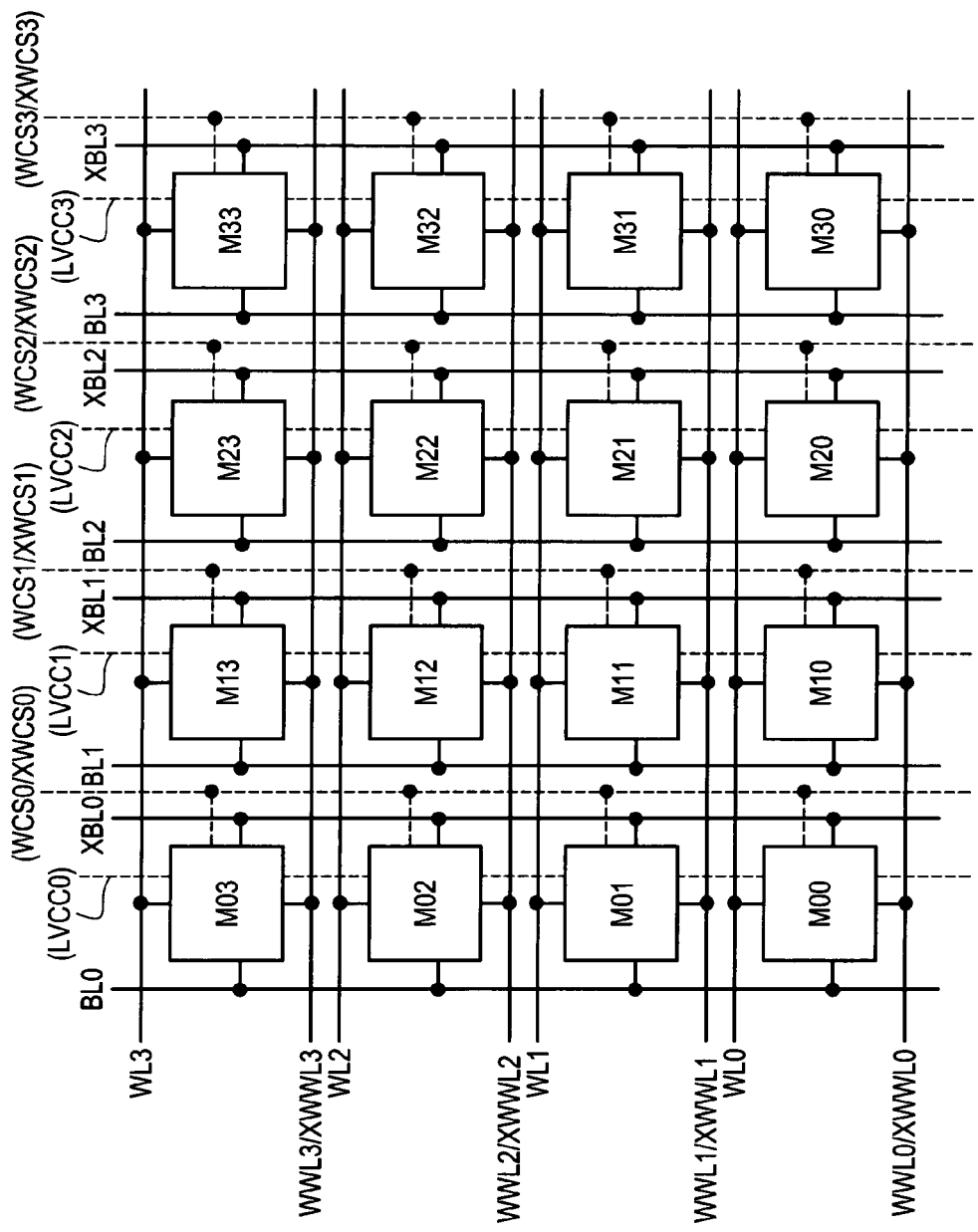
FIG. 2 is a circuitry block diagram showing an example of cell array.

FIG. 2 is a circuit block diagram that shows part of the memory cell array 1.

The part of the memory cell array 1 shown in the drawing includes memory cells M00 to M33, which are arranged in four rows and four columns. Furthermore, bit lines BL0 to BL3 and XBL0 to XBL3 are arranged in the direction of the columns, and word lines WL0 to WL3 are arranged in the direction of the rows.

A pair of bit lines BL0 and XBL0 are connected to memory cells M00, M01, M02 and M03, which are disposed in a first column, and word line WL0 and write word line WWL0 are connected to memory cells M00, M10, M20 and M30, which are disposed in a first row. Furthermore, other bit lines BL1 to BL3 and XBL1 to XBL3 are connected in the same manner to memory cells M10 to M13, M20 to M23 and M30 to M33, which are disposed in other columns, respectively. Also, other word lines WL1 to WL3 and write word lines WWL1 to WWL3 are connected in the same manner to memory cells M01 to M31, M02 to M32 and M03 to M33, which are disposed in other rows, respectively.

The row decoder 4 decodes upper addresses Add2 and outputs selection signals at a high level of electrical potential as active state to word lines WL0 to WLm (WL0 to WL3 in FIG. 2) and to write word lines WWL0 to WWLm. However, the selection signals for the write word lines WWL0 to WWLm (WWL0 to WWL3 in FIG. 2) are output only when a write-enable signal WE is present.

The column decoder 5 decodes lower addresses Add1 and outputs column-selection signals CS0 to CSn.

The internal CLK circuit 6 generates the internal clock signal on the basis of the external clock signal CLK and the write-enable signal WE, for the operation of the IO circuit 3, the row decoder 4 and the column decoder 5.

The column selector 2 connects one pair of bit lines BL0 to BLn and XBL0 to XBLn (BL0 to BL3 and XBL0 to BL3 in FIG. 2) from the memory cell array 1 with bit lines BL and XBL in response to the column-selection signals CS0 to CSn received from the column decoder 5, which will be described later (the bit lines selected are indicated as BLc and XBLc). Through the bit lines connected by the column selector 2, signals flow in both directions. In other words, for writing, the circuit on the side of bit lines BL and XBL drives the circuit on the side of bit lines BLc and XBLc, and for reading, the circuit on the side of bit lines BLc and XBLc drives that on the side of bit lines BL and XBL.

The IO circuit 3 interfaces the bit lines BL and XBL for data input DIN and data output DOUT. In other words, for reading, the electrical potentials of bit lines BL and XBL are detected and retained by a sense amplifier (not shown) for data output DOUT, and for writing, the input voltage from data input DIN is converted into an action logic in the writing operation, which logic is output to bit lines BL and XBL.

Now, the memory cell M00 is described.

Figure 3:
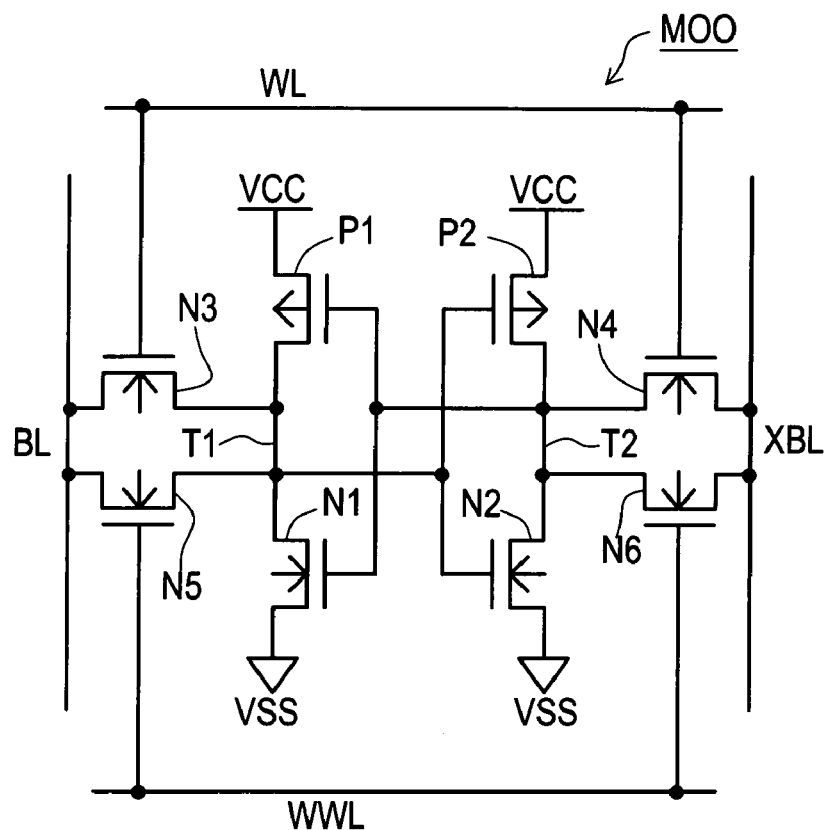
FIG. 3 is a circuit diagram showing a memory cell as a first embodiment.

FIG. 3 is a circuit diagram showing the memory cell M00 as a first embodiment. The memory cell M00 comprises a p-type MOS transistor P1 and an n-type MOS transistor N1 that are connected in series between a supply voltage VCC and a ground voltage VSS, and a p-type MOS transistor P2 and an n-type MOS transistor N2 that are connected in series between a supply voltage VCC and a ground voltage VSS. These MOS transistors N1, P1, N2 and P2 constitute a pair of inverters, which are cross-coupled, and a latch circuit, which maintains electrical potentials stable at junction T1 and at junction T2.

Furthermore, the memory cell M00 comprises an n-type MOS transistor N3 and an n-type MOS transistor N5 that are disposed between bit line BL and junction T1, which leads to p-type MOS transistor P1 and n-type MOS transistor N1. It further comprises an n-type MOS transistor N4 and an n-type MOS transistor N6 that are disposed between bit line XBL and junction T2, which leads to p-type MOS transistor P2 and n-type MOS transistor N2. N-type MOS transistors N3 and N5 constitute a switch that makes the line between junction T1 and bit line BL electrically conductive, and n-type MOS transistors N4 and N6 constitute a switch that makes the line between junction T2 and bit line XBL conductive.

In addition, the gates of n-type MOS transistors N3 and N4 are connected to the word line WL, which is activated by a selection signal when a reading operation or a writing operation takes place. The gates of n-type MOS transistors N5 and N6 are connected to the write word line WWL, which is activated by a selection signal when a writing operation takes place.

Figure 4:
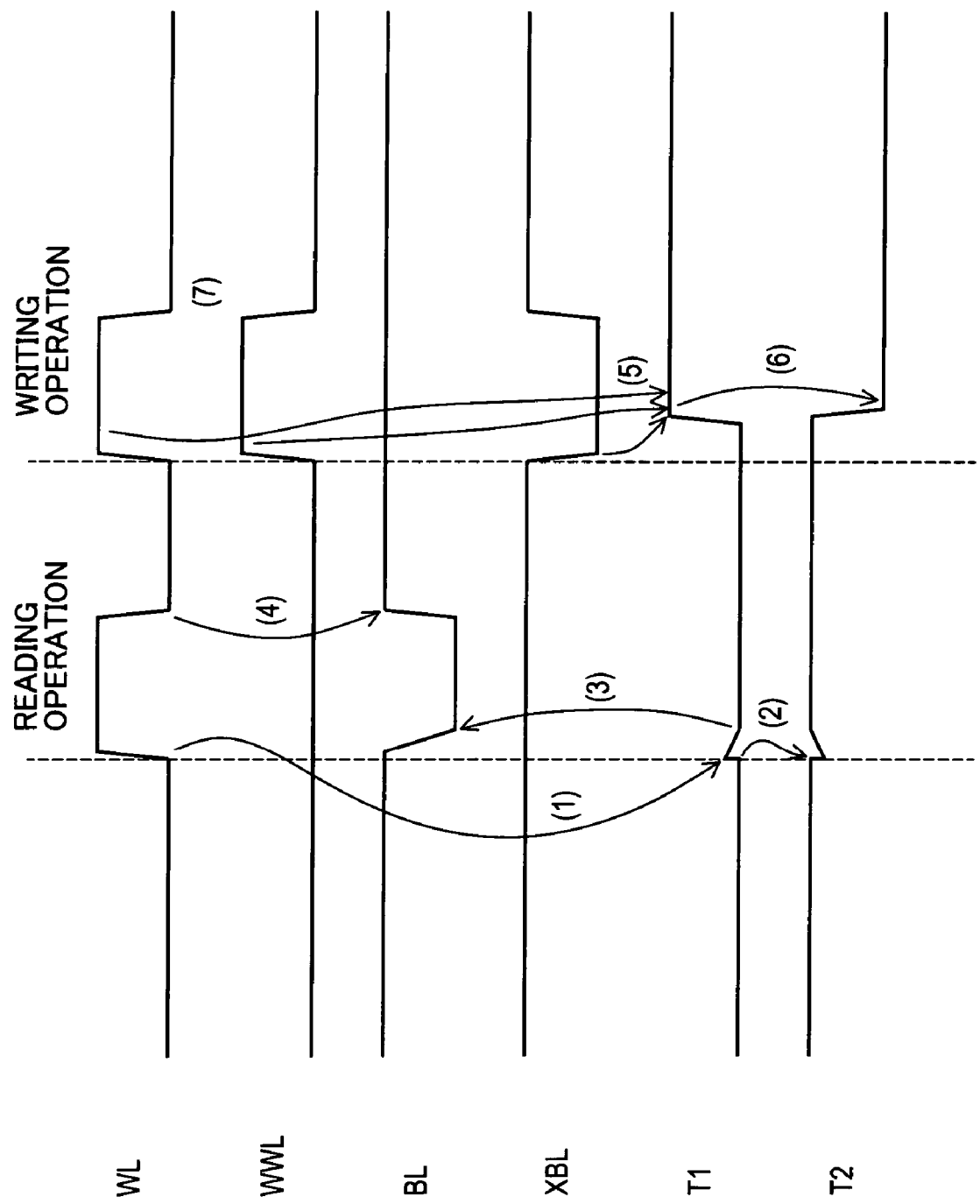
FIG. 4 is a timing chart showing the operation of the memory cell as a first embodiment.

Now, the operation of the memory cell M00 is described in reference to FIG. 4.

For describing the reading operation of the memory cell, a description is made of the operation for a case where the electrical potential at junction T1 is at a low level while the electrical potential at junction T2 is at a high level. For describing the writing operation, a description is made of the operation that turns the electrical potential at junction T1 to a high level and that at junction T2 to a low level in a case where the electrical potential at junction T1 has been at a low level while that at junction T2 has been at a high level.

Prior to the reading operation or writing operation, the bit lines BL and XBL are pre-charged to a level at the supply voltage VCC.

At first, the reading operation is explained. The operation involves the following actions, which are illustrated and indicated by (1) to (4) in FIG. 4.

At (1) indicated in FIG. 4, when the word line WL is turned from a low level to a high level by a selection signal, n-type MOS transistor N3 is made conductive, and the electrical charge of bit line BL is discharged through n-type MOS transistors N3 and N1 to the ground voltage VSS (refer to FIG. 3). This discharging raises the electrical potential at junction T1, but the electrical potential rising at junction T1 is held lower than the threshold that triggers the inversion of the inverter, which comprises p-type MOS transistor P2 and n-type MOS transistor N2. This is because the ratio of the activated resistances of n-type MOS transistor N1 to n-type MOS transistor N3 is relative small since the conductance of n-type MOS transistor N1 is set greater than that of n-type MOS transistor N3. As a result, the electrical potential at junction T1 thereafter is kept stable.

At (2), by the rise of the electrical potential at junction T1, the electrical potential at junction T2 drops, but this drop of the electrical potential at junction T2 is held to a small degree because the rise of the electrical potential at junction T1, which corresponds, is also small. Therefore, the electrical potential dropping at junction T2 does not reach the threshold that triggers the inversion of the inverter that comprises p-type MOS transistor P1 and n-type MOS transistor N1. As a result, the electrical potential at junction T2 thereafter is maintained stable.

At (3), when the charge of bit line BL is discharged completely, the electrical potential of bit line BL comes to a low level. The level of bit line BL and that of bit line XBL are transmitted through the column selector 2 to the IO circuit 3 (refer to FIG. 1), and the content of the memory cell M00 is detected by the sense amplifier (not shown) of the IO circuit 3 and output to the data output DOUT.

At (4), when the word line WL turns to a low level, n-type MOS transistors N3 and N4 become non-conductive, and the reading operation completes. At the same time, the bit lines BL and XBL are pre-charged again to a level at the supply voltage VCC.

Now, the writing operation is described. This operation includes the following actions, which are illustrated and indicated by (5) to (7) in FIG. 4.

At (5), the word line WL and the write word line WWL are, respectively, turned to a high level, and bit line XBL is turned to a low level. As a result, n-type MOS transistors N4 and n-type MOS transistor N6 become conductive. In this condition, a current flows from the source at the supply voltage VCC through p-type MOS transistor P2 and n-type MOS transistors N4 and N6 to bit line XBL (refer to FIG. 3). Here, the composite conductance of n-type MOS transistors N4 and N6, which are connected in parallel with each other, is preset greater than that of p-type MOS transistor P2.

At (6), the electrical potential at junction T2 comes close to the ground voltage VSS. As a result, the inverter comprising p-type MOS transistor P1 and n-type MOS transistor N1 is inverted, and this inversion turns the electrical potential at junction T1 to a high level. Therefore, the electrical potential at junction T2 thereafter is maintained stable at the low level.

At (7), when the word line WL and the write word line WWL are turned to a low level, n-type MOS transistors N3, N4, N5 and N6 become non-conductive, completing the writing operation (refer to FIG. 3). At the same time, the bit lines BL and XBL are pre-charged again to a level at the supply voltage VCC.

In the memory cell M00 as a first embodiment, the MOS transistors N1, P1, N3 and N5 have the following relations in conductance.

As for n-type MOS transistor N1 and p-type MOS transistor P1, the conductance of each transistor is preset to an approximately identical value, so that the threshold voltage Vth is about a half of the supply voltage. Also, for n-type MOS transistor N1 and n-type MOS transistor N3, the conductance of n-type MOS transistor N1 is preset greater than that of n-type MOS transistor N3 (N1>N3) as practiced in the prior art.

Furthermore, for n-type MOS transistor N3, n-type MOS transistor N5 and p-type MOS transistor P1, the composite conductance of n-type MOS transistor N3 and n-type MOS transistor N5 connected in parallel is preset greater than that of p-type MOS transistor P1 (composite value >P1).

In the memory cell M00 as a first embodiment, for the writing operation, n-type MOS transistor N3 and n-type MOS transistor N5 are controlled to be conductive. In this way, the electrical potential at junction T1 is lowered to a level that triggers an inversion of the inverter in the writing operation for a case where bit line BL is at a low level. This ensures reliable writing operation.

The above description is for the MOS transistors N1, P1, N3 and N5. The same is true for the MOS transistors N2, P2, N4 and N6, which are disposed in symmetry.

Therefore, the single port SRAM as a first embodiment retains the stored contents, which are represented by the electrical potentials at respective junctions T1 and T2 of the memory cell M00, reliably even in a case where the margin for static noise on the threshold voltage Vth is relatively small because of a low supply-voltage being applied. Furthermore, the SRAM in this arrangement can perform writing operation reliably.

Now, a single port SRAM as a second embodiment is explained. This SRAM has the same construction with a memory cell array as the first embodiment. The only difference is that memory cell MA00 is used instead of memory cell M00.

Figure 5:
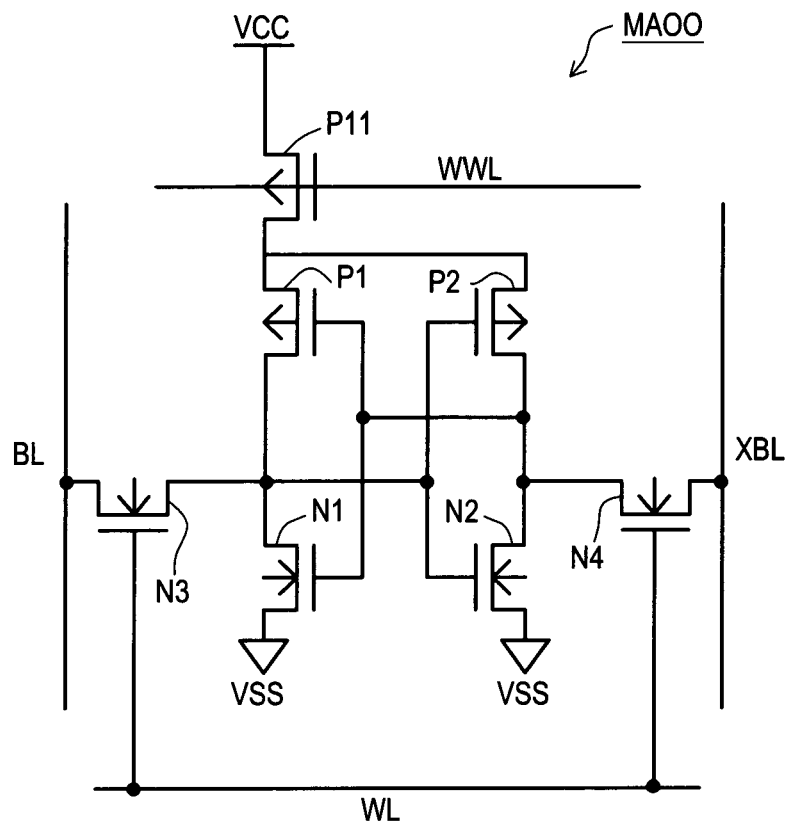
FIG. 5 is a circuit diagram showing a memory cell as a second embodiment.

FIG. 5 is a circuit diagram of a memory cell MA00 as a second embodiment. The MOS transistors N1, P1, N2, P2, N3 and N4 are arranged in the same way as the memory cell M00, i.e., the first embodiment, so no description of them is given here.

The memory cell MA00 comprises a p-type MOS transistor P11 that is disposed between the supply voltage VCC and the junction of p-type MOS transistor P1 and p-type MOS transistor P2. The gate of this p-type MOS transistor P11 is connected to the write word line WWL.

Now, the operation of the memory cell MA00 is described.

For the reading operation, the electrical potentials at junctions T1 and T2 are maintained stable because the conductance of p-type MOS transistor P1 and that of n-type MOS transistor N1 are preset approximately equal to each other in the memory cell MA00.

For the writing operation, p-type MOS transistor P11 is controlled to be non-conductive. Therefore, the path from the supply voltage VCC to junction T1 and to junction T2 is blocked. As a result, the electrical potential at junction T1 or junction T2 that leads to the bit line that turns to a low level of the bit lines BL and XBL is turned securely to a low level. For example, in a case where bit line BL is at a low level, the electrical potential at junction T1 is at a low level notwithstanding the conductance of p-type MOS transistor P1. Therefore, the inverter comprising p-type MOS transistor P2 and n-type MOS transistor N2 is inverted, so that the writing operation is performed reliably.

In the writing operation, the word line WL is turned to a high level of electrical potential by a selection signal, and the write word line WWL is turned also to a high level by a selection signal, so that the electrical potential set on bit lines BL and XBL is written into the memory cell MA00. When the writing operation completes, the word line WL is turned to a low level, and the write word line WWL is also turned to a low level. Here, the turning of the word line WL is preferably timed a little later than the turning of the write word line WWL. This is because the operation can be stabler if the bit lines BL and XBL are provided with an electrical potential until the voltages at junctions T1 and T2 are locked by the latch circuit after p-type MOS transistor P11 has become conductive.

Therefore, the single port SRAM as a second embodiment retains the stored contents, which are represented by the electrical potentials at respective junctions T1 and T2 of the memory cell MA00, reliably even in a case where the margin for static noise on the threshold voltage Vth is relatively small because of a low supply voltage being applied. In addition, the SRAM can perform writing operation reliably.

Now, a single port SRAM as a third embodiment is explained. This SRAM has a general construction with a memory cell array similar to that of the first embodiment. The only difference is that the third embodiment comprises, instead of the write word line WWL, another write word line XWWL whose logical level is the reversal of that of the write word line WWL in the first embodiment. Therefore, only the part that relates to the write word line XWWL is explained here, so the same part as the first embodiment is not described here or is described in a simplified manner.

At first, referring to FIG. 1, the row decoder 4 decodes upper addresses Add2 and outputs selection signals at a high level of electrical potential as active state to word lines WL0 to WLm (WL0 to WL3 in FIG. 2) and outputs selection signals at a low level as active state to write word lines XWWL0 to XWWLm. However, the selection signals for the write word lines XWWL0 to XWWLm (XWWL0 to XWWL3 in FIG. 2) are output only when a write-enable signal WE is activated.

As shown in FIG. 2, the memory cell array 1 comprises write word lines XWWL0 to XWWLm instead of write word lines WWL0 to WWLm. Word line WL0 and write word line XWWL0 are connected to memory cells M00, M10, M20 and M30, which are disposed in a first row. Also, other word lines WL1 to WL3 and write word lines XWWL1 to XWWL3 are connected in the same manner to memory cells M01 to M31, M02 to M32 and M03 to M33, which are disposed in other rows, respectively.

Figure 6:
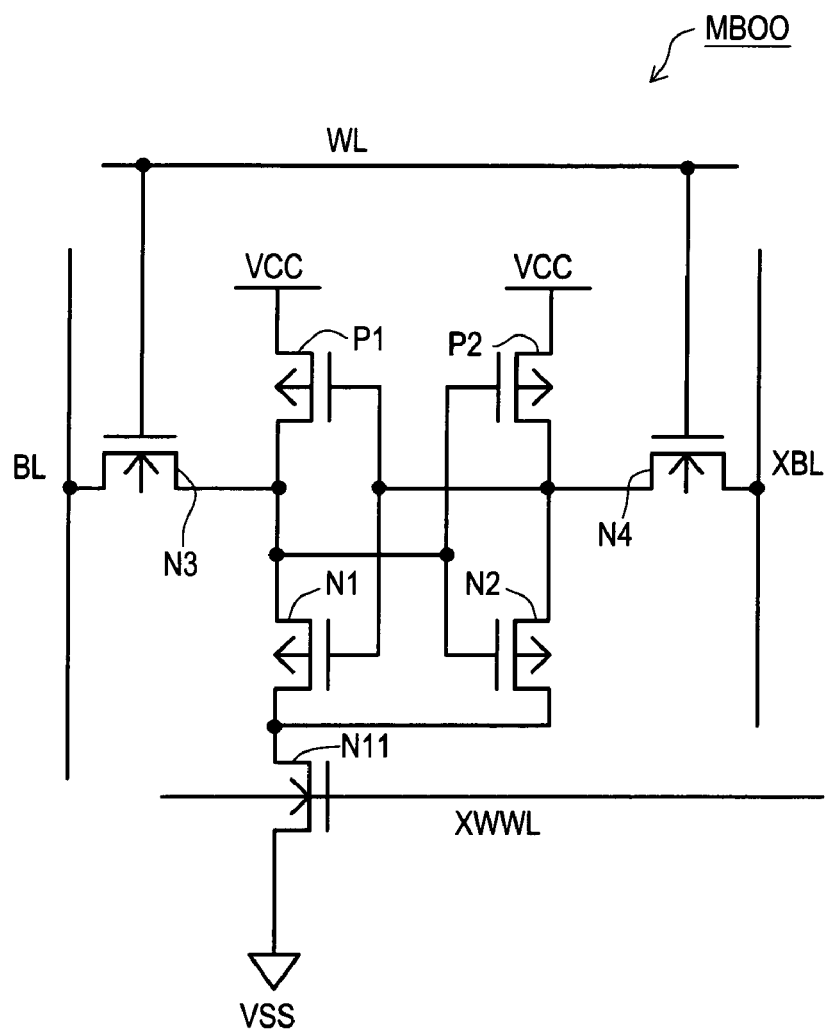
FIG. 6 is a circuit diagram showing a memory cell as a third embodiment.

FIG. 6 is a circuit diagram of a memory cell MB00 as a third embodiment. The MOS transistors N1, P1, N2, P2, N3 and N4 are arranged in the same way as in the memory cell M00, i.e., the first embodiment, so no description of them is given here.

The memory cell MB00 comprises an n-type MOS transistor N11 that is disposed between the ground voltage VSS and the junction of n-type MOS transistor N1 and n-type MOS transistor N2. The gate of this n-type MOS transistor N11 is connected to the write word line XWWL.

Now, the operation of the memory cell MB00 is described.

For the reading operation, the electrical potentials at junctions T1 and T2 are maintained stable because the conductance of p-type MOS transistor P1 and that of n-type MOS transistor N1 are preset approximately equal to each other in the memory cell MB00.

For the writing operation, n-type MOS transistor N11 is controlled to be non-conductive. Therefore, the path from the ground voltage VSS to junction T1 and to junction T2 is blocked. As a result, the electrical potential at junction T1 or junction T2 that leads to the bit line that turns to a high level of the bit lines BL and XBL is turned securely to a high level. For example, in a case where bit line BL is at a high level, the electrical potential at junction T1 is at a high level. Therefore, the inverter comprising p-type MOS transistor P2 and n-type MOS transistor N2 is inverted, so that the writing operation is performed reliably.

In the writing operation, the word line WL is turned to a high level by a selection signal, and the write word line XWWL is turned to a low level by a selection signal, so that the electrical potential set on bit lines BL and XBL is written into the memory cell MB00. When the writing operation completes, the word line WL is turned to a low level, and the write word line XWWL is turned to a high level. Here, the turning of the word line WL is preferably timed a little later than the turning of the write word line XWWL. This is because the operation can be stabler if the bit lines BL and XBL are provided with an electrical potential until the voltages at junctions T1 and T2 are locked by the latch circuit after n-type MOS transistor N11 has become conductive.

Therefore, the single port SRAM as a third embodiment retains the stored contents, which are represented by the electrical potentials at respective junctions T1 and T2 of the memory cell MB00, reliably even in a case where the margin for static noise on the threshold voltage Vth is relatively small because of a low supply voltage being applied. In addition, the SRAM can perform writing operation reliably.

Now, a single port SRAM as a fourth embodiment is explained. This SRAM has a general construction with a memory cell array including a write word line XWWL, which is similar to that of the third embodiment. However, it is different from the third embodiment in that the memory cell array 1 includes a write column line WCS. Therefore, only the part that relates to the write column line WCS is explained, so the same part as the third embodiment is not described here or is described in a simplified manner.

At first, referring to FIG. 1, the column decoder 5 decodes lower addresses Add1 and outputs column-selection signals CS0 to CSn. Furthermore, if a write-enable signal WE is active, then write column lines WCS0 to WCSn that correspond to the column selection signals CS0 to CSn are turned to a high level.

In the memory cell array 1, which is shown in FIG. 2, write column line WCS0 is connected to memory cells M00, M01, M02 and M03, which are disposed in a first column. Also, other write column lines WCS1 to WCS3 are connected in the same manner to memory cells M10 to M13, M20 to M23 and M30 to M33, which are disposed in other columns, respectively.

Figure 7:
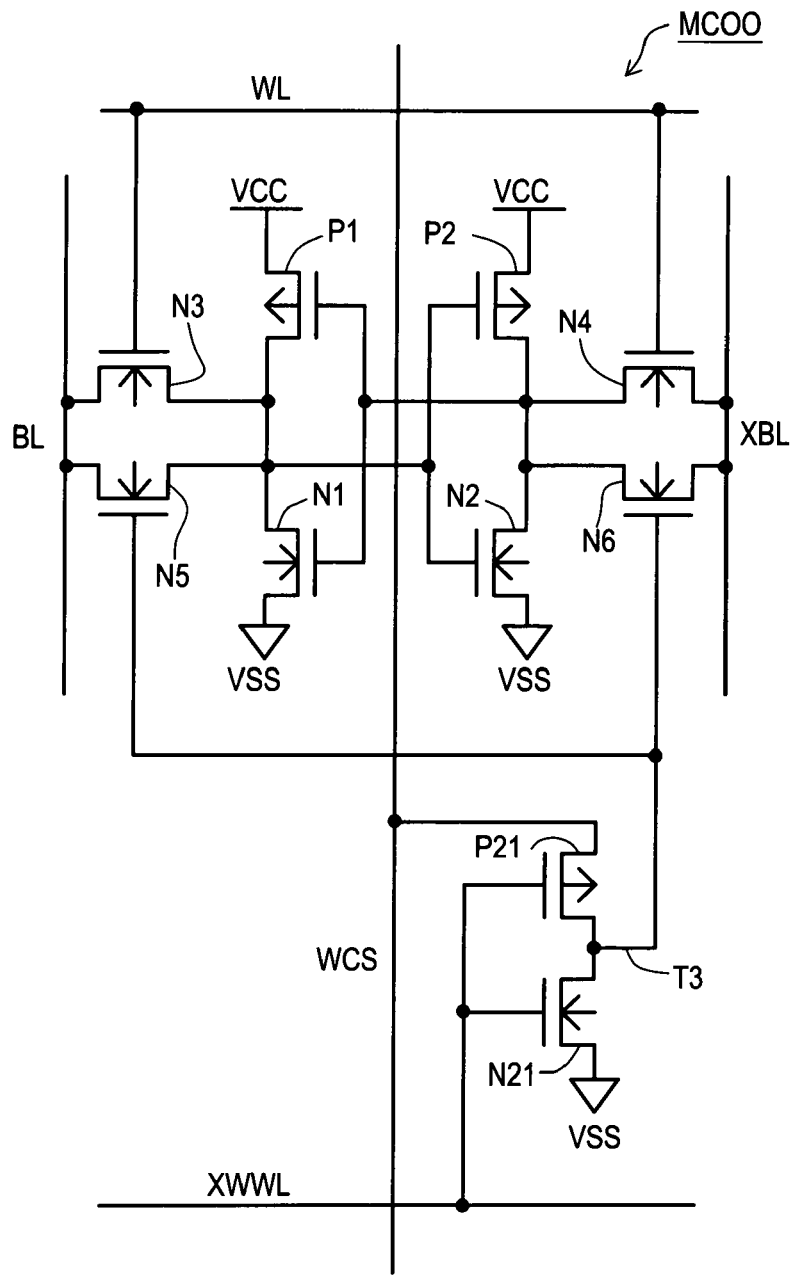
FIG. 7 is a circuit diagram showing a memory cell as a fourth embodiment.

FIG. 7 is a circuit diagram of a memory cell MC00 as a fourth embodiment. The MOS transistors N1, P1, N2, P2, N3, N4, N5 and N6 are arranged in the same way as the memory cell M00, i.e., the first embodiment, so no description of them is given here.

This memory cell MC00 comprises a p-type MOS transistor P21 and an n-type MOS transistor N21 that are connected in series between the write column line WCS and the ground voltage VSS. The gates of p-type MOS transistor P21 and of n-type MOS transistor N21 are connected to the write word line XWWL.

Now, the operation of the memory cell MC00 is described.

For the reading operation, the electrical potentials at junctions T1 and T2 are maintained stable because the conductance of p-type MOS transistor P1 and that of n-type MOS transistor N1 are preset approximately equal to each other in the memory cell MC00.

For the writing operation, only when the write column line WCS is at a high level and the write word line XWWL is at a low level, the electrical potential at junction T3 between p-type MOS transistor P21 and n-type MOS transistor N21 rises to a high level (other combinations of selection signals for the write column line WCS and the write word line XWWL maintain the electrical potential at junction T3 at a low level). Therefore, only n-type MOS transistors N5 and N6 are controlled to be conductive in the memory cell MC00 as a target in the writing operation because the memory cell MC00 is connected to the bit lines BL and XBL in the selected column, and the write word line XWWL is turned to a low level in the memory cell MC00.

By the way, in the case of memory cell M00 as a first embodiment, when the write word line WWL is activated, n-type MOS transistors N5 and N6 become conductive in the memory cells in a row (for example, memory cells M00, M10, M20 and M30 when the write word line WWL0 is activated in FIG. 2). In this instance, the electrical potential at junction T1 or junction T2 that is to be maintained at a low level may rise and diminish the margin set for static noise.

However, in memory cell MC00 as a fourth embodiment, n-type MOS transistors N5 and N6 are not conductive in the memory cell MC00 that is not a target in the writing operation, so the noise margin is not diminished. Therefore, the electrical potentials at junction T1 and junction T2 are maintained securely. For the writing operation, n-type MOS transistors N5 and N6 are made conductive, so that the writing operation is performed reliably as in the first embodiment.

Figure 8:
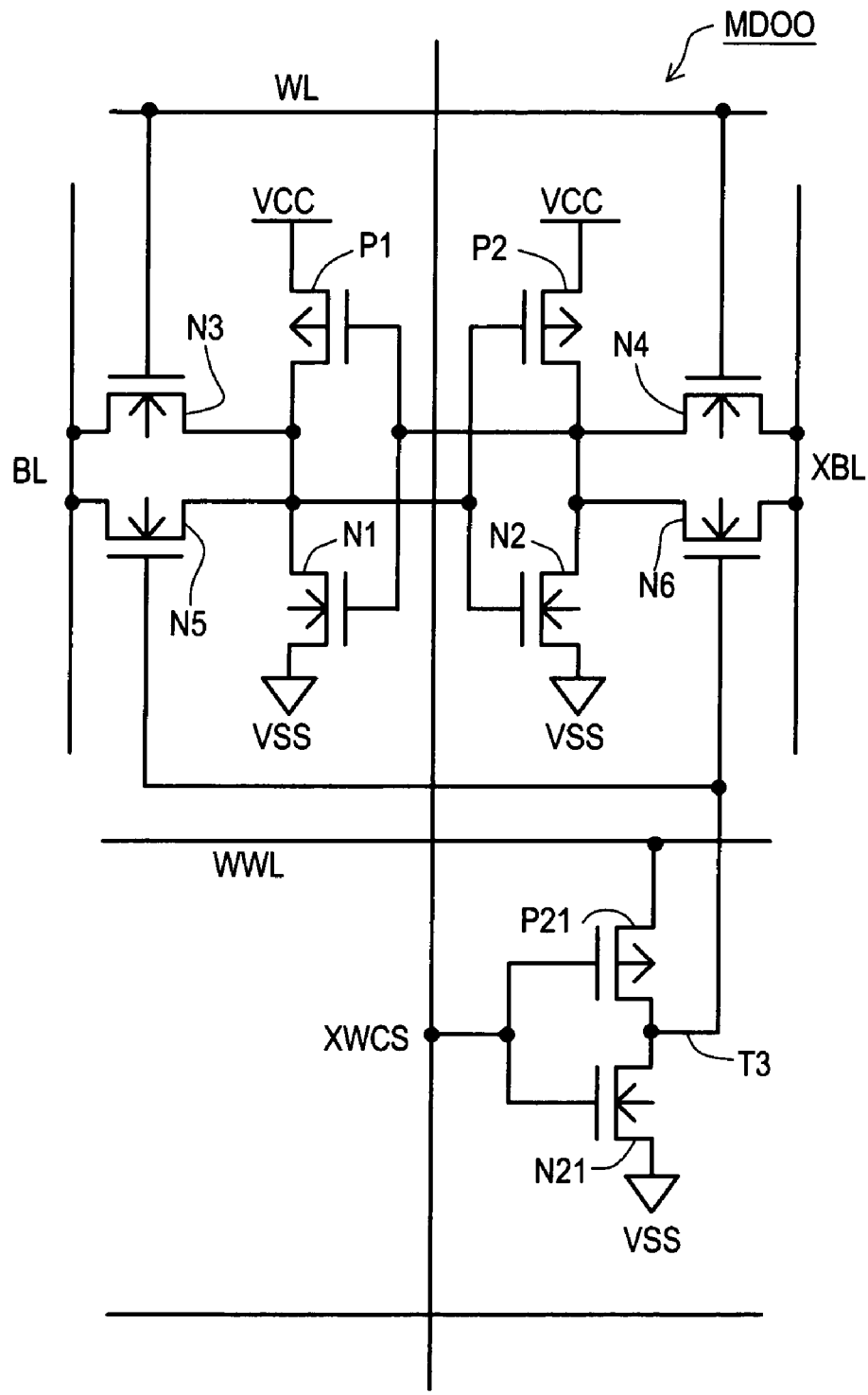
FIG. 8 is a circuit diagram showing another example of memory cell as the fourth embodiment.

FIG. 8 is a circuit diagram of another example of a memory cell MD00 as a fourth embodiment. This memory cell MD00 comprises a p-type MOS transistor P21 and an n-type MOS transistor N21 as the memory cell MC00, but it is different in that the source of p-type MOS transistor P21 is connected to the write word line WWL. The gates of p-type MOS transistor P21 and n-type MOS transistor N21 are connected to write column line XWCS, which is provided with a logic signal that is the reversal of a selection signal on write column line WCS.

In this memory cell MD00, for the writing operation, only when the write word line WWL is at a high level and the write column line XWCS is at a low level, the electrical potential at junction T3 between p-type MOS transistor P21 and n-type MOS transistor N21 rises to a high level. In other words, only n-type MOS transistors N5 and N6 in memory cell MD00 that is a target in the writing operation are controlled to be conductive as in the case of memory cell MC00.

Figure 9:
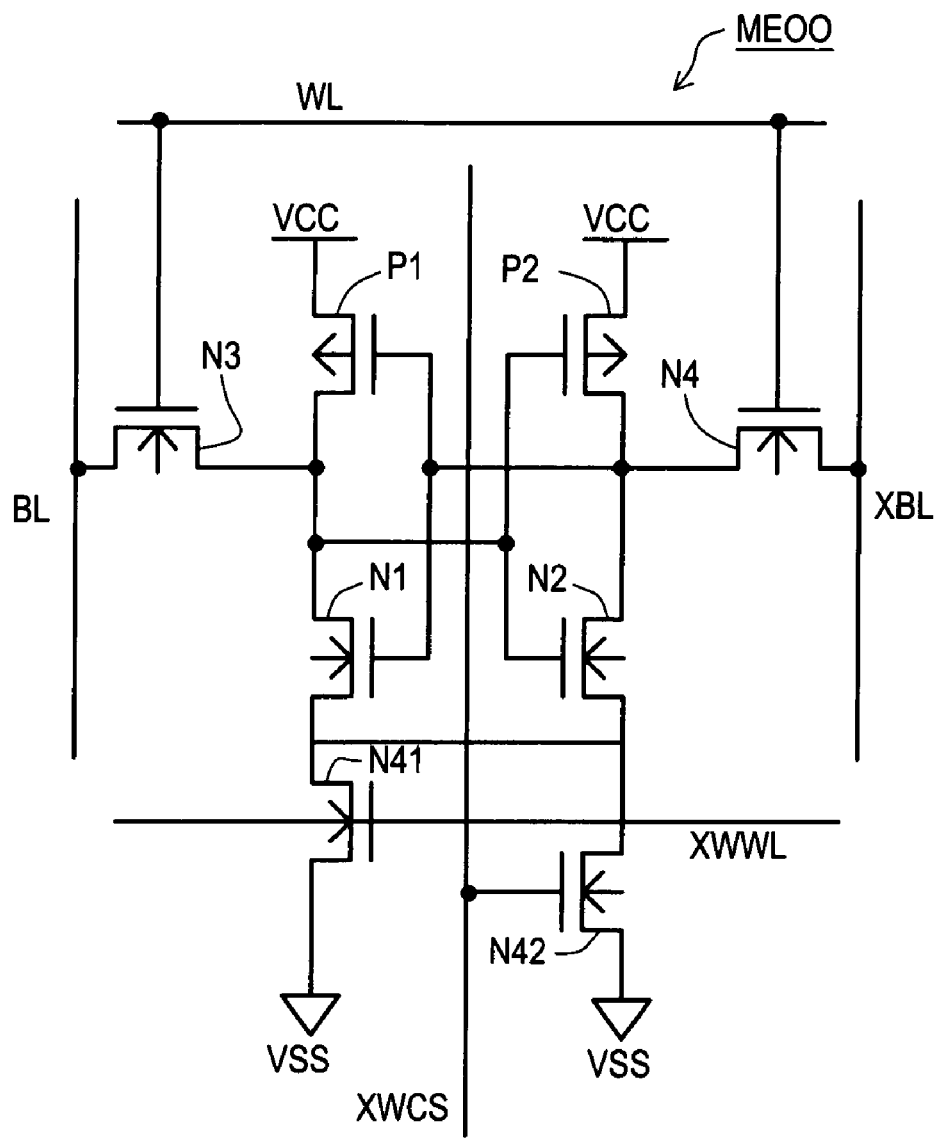
FIG. 9 is a circuit diagram showing yet another example of memory cell as the fourth embodiment.

FIG. 9 is a circuit diagram of yet another example of a memory cell ME00 as a fourth embodiment. The MOS transistors N1, P1, N2, P2, N3 and N4 are arranged in the same way as the memory cell M00, i.e., the first embodiment, so no description of them is given here.

This memory cell ME00 comprises an n-type MOS transistor N41 and an n-type MOS transistor N42 that are connected between the ground voltage VSS and the sources of n-type MOS transistors N1 and N2. The gate of n-type MOS transistor N41 is connected to the write word line XWWL, and the gate of n-type MOS transistor N42 is connected to the write column line XWCS.

Now, the operation of the memory cell ME00 is described.

For the reading operation, the electrical potentials at junctions T1 and T2 are maintained stable because the conductance of p-type MOS transistor P1 and that of n-type MOS transistor N1 are preset approximately equal to each other in the memory cell ME00.

For the writing operation, only when the write column line XWCS is at a low level and the write word line XWWL is at a low level, the path from the sources of n-type MOS transistors N1 and N2 to the ground voltage VSS is blocked. In other words, this path only in the memory cell ME00 that is a target in the writing operation is blocked.

By the way, in the case of a memory cell MB00 as a third embodiment, when the write word line XWWL is activated, the path from the ground voltage VSS to n-type MOS transistors N1 and N2 is blocked in the memory cells in a row (for example, memory cells M00, M10, M20 and M30 when the write word line XWWL0 is activated in FIG. 2). In this instance, the electrical potential at junction T1 or junction T2 that is to be maintained at a low level may rise and diminish the margin set for static noise.

However, in memory cell ME00, the path to n-type MOS transistors N1 and N2 in the memory cell ME00 that is not a target in the writing operation is not blocked, so the noise margin is not diminished. Therefore, the electrical potentials at junction T1 and junction T2 are maintained securely. Furthermore, for the writing operation, n-type MOS transistors N41 and N42 are controlled to be non-conductive, so that the writing operation is performed reliably as in the third embodiment.

Figure 10:
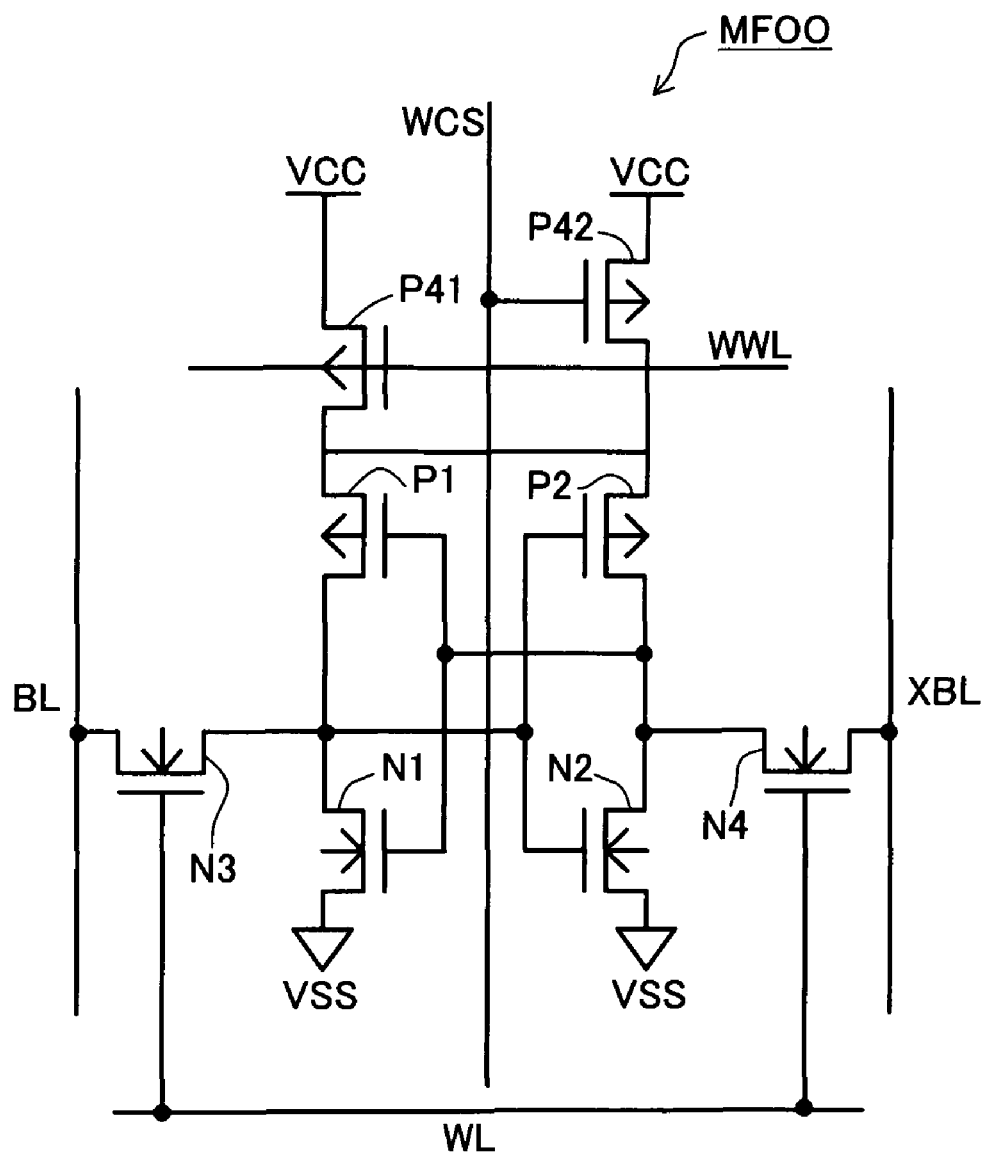
FIG. 10 is a circuit diagram showing another example of memory cell as the fourth embodiment.

FIG. 10 is a circuit diagram of yet another example of a memory cell MF00 as a fourth embodiment. The memory cell MF00 comprises p-type MOS transistors P41 and P42 that are connected between the supply voltage VCC and p-type MOS transistors P1 and P2, instead of n-type MOS transistors N41 and N42 in the case of the memory cell ME00. The gate of p-type MOS transistor P41 is connected to the write word line WWL, and the gate of p-type MOS transistor P42 is connected to the write column line WCS.

For the writing operation in the memory cell MF00, only when the write word line WWL is at a high level and the write column line WCS is at a high level, the path from the supply voltage VCC to p-type MOS transistors P1 and P2 is blocked. In other words, the path from the supply voltage VCC to p-type MOS transistors P1 and P2 only in the memory cell ME00 that is a target in the writing operation is blocked.

Consequently, also in memory cell MF00, the path to p-type MOS transistors P1 and P2 in the memory cell MF00 that is not a target in the writing operation is not blocked, so the noise margin is not diminished. Therefore, the electrical potentials at junction T1 and junction T2 are maintained securely. As a result, the writing operation is performed reliably as in memory cell MA00 of the second embodiment.

Now, a single port SRAM as a fifth embodiment is explained. This SRAM has a general construction similar to that of the other example described above as a fourth embodiment. Specifically, a write column line WCS is provided for each column of memory cells.

Figure 11:
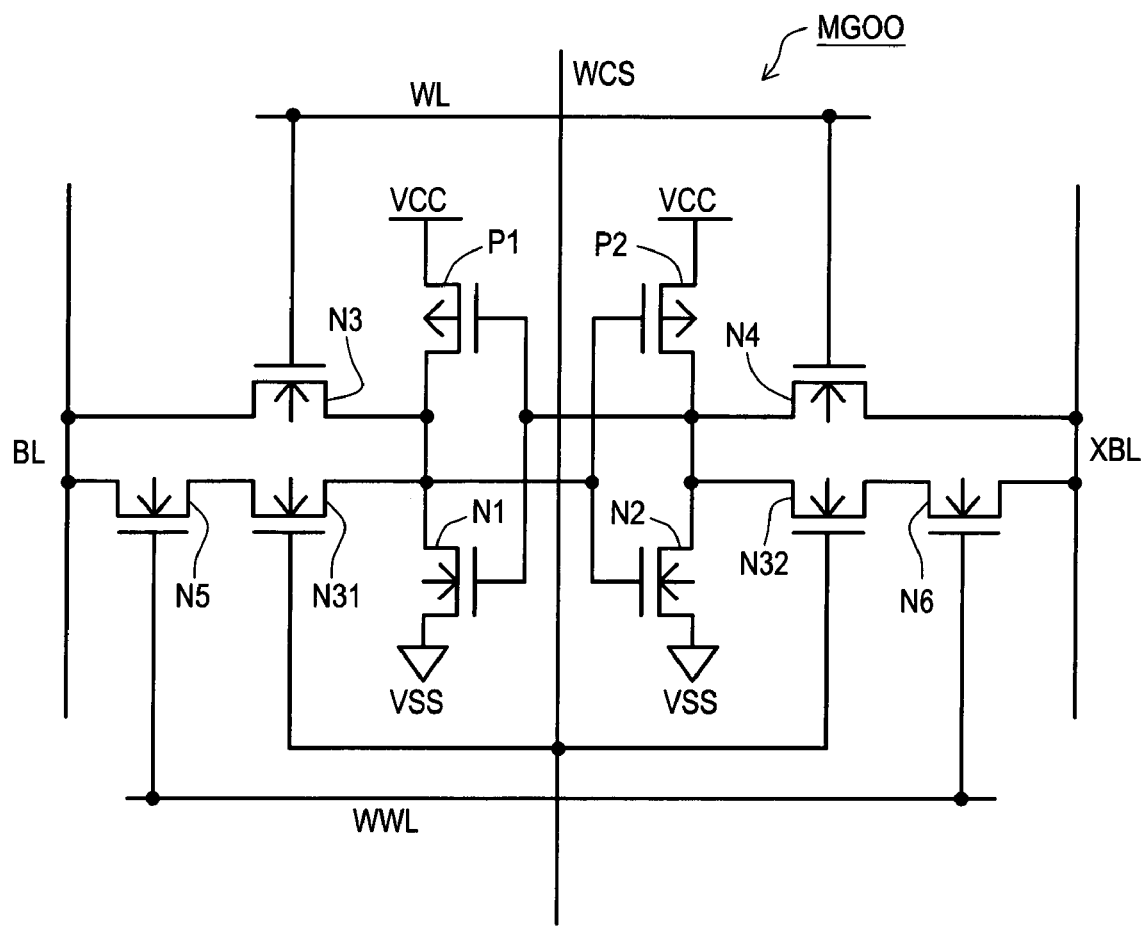
FIG. 11 is a circuit diagram showing a memory cell as a fifth embodiment.

FIG. 11 is a circuit diagram of a memory cell MG00 as a fifth embodiment. This memory cell MG00 comprises an n-type MOS transistor N31 that is connected between n-type MOS transistors N5 and junction T1, and it also comprises an n-type MOS transistor N32 that is connected between n-type MOS transistor N6 and junction T2. The gates of n-type MOS transistors N31 and N32 are connected to a write word line WWL, respectively.

The write column line WCS is at a low level, and the path through n-type MOS transistors N5 and N6 is blocked in the memory cell MG00 that is not a target in the writing operation. As a result, the electrical potentials at junction T1 and junction T2 are maintained securely without inversion of the inverter. Furthermore, for the writing operation, the path through n-type MOS transistors N5 and N6 is made conductive, so that the writing operation is performed reliably as in the first embodiment.

Now, a single port SRAM as a sixth embodiment is explained. This SRAM has a general construction different from those of the first to fifth embodiments. Instead of the supply voltage VCC applied in the preceding embodiment, this embodiment comprises another supply voltage LVCC, which is provided to memory cells in each column (LVCC0 to LVCC3 in FIG. 2) from a supply-voltage switching circuit 7 (the part indicated by broken line in FIG. 1).

Figure 12:
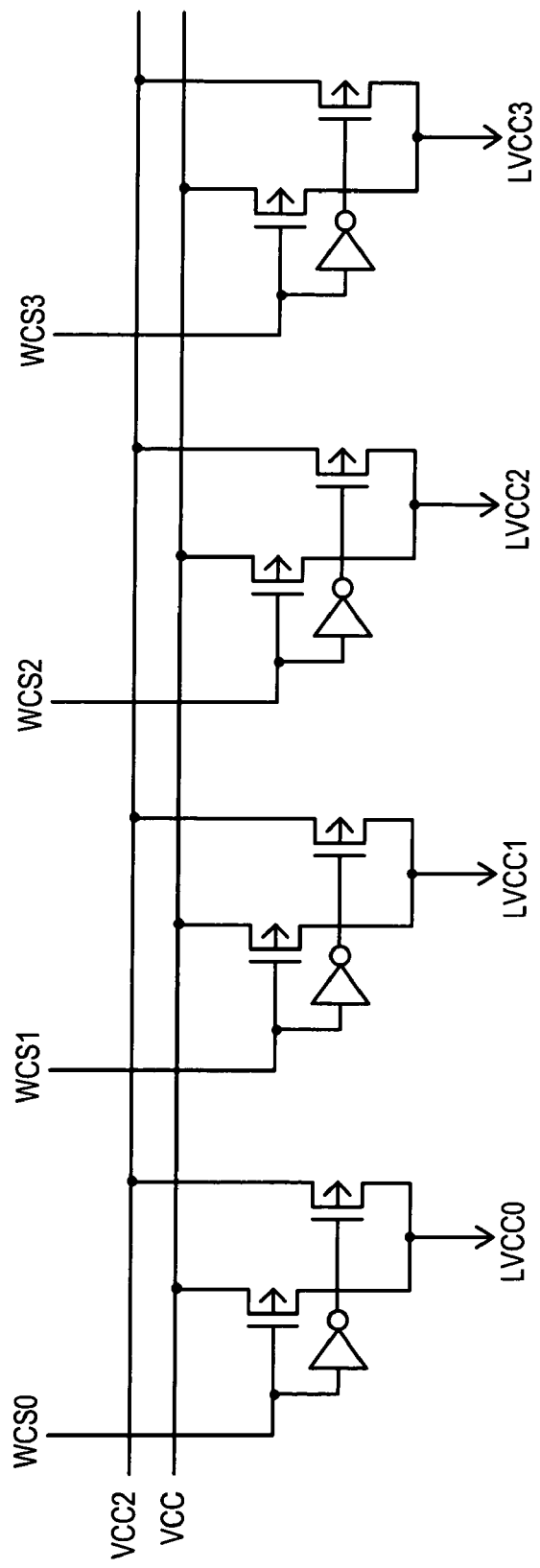
FIG. 12 is a circuit diagram showing an example of source-voltage switching circuit.

FIG. 12 is a circuit diagram of a concrete example of supply-voltage switching circuit 7. The supply-voltage switching circuit 7 outputs a supply voltage LVCCi that is selected from two supply voltages, a supply voltage VCC and a second supply voltage VCC2, for each column of the bit lines BLi and XBLi (i=0 to 3) in response to a selection signal on a write column line WCSi. The second supply voltage VCC2 is an electrical potential lower than the supply voltage VCC and supplied from the outside of the SRAM. Specifically, when the write column line WCSi is at a low level, the supply voltage VCC is output as the supply voltage LVCCi. When the write column line WCSi is at a high level, the second supply voltage VCC2 is output as the supply voltage LVCCi.

Figure 13:
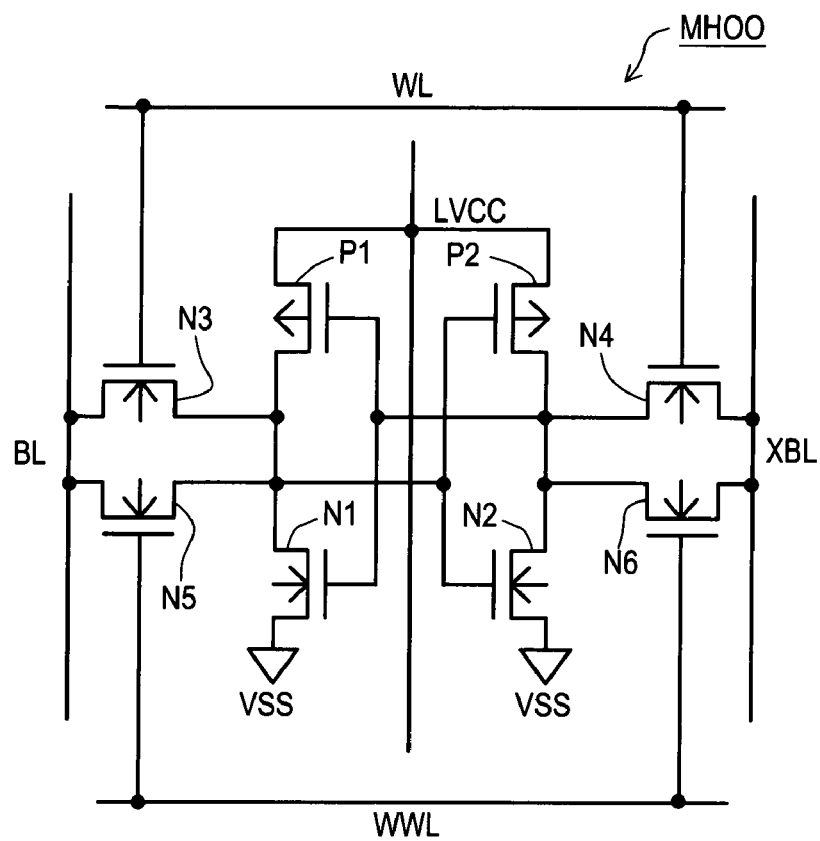
FIG. 13 is a circuit diagram showing a memory cell as a sixth embodiment.
Figure 14:
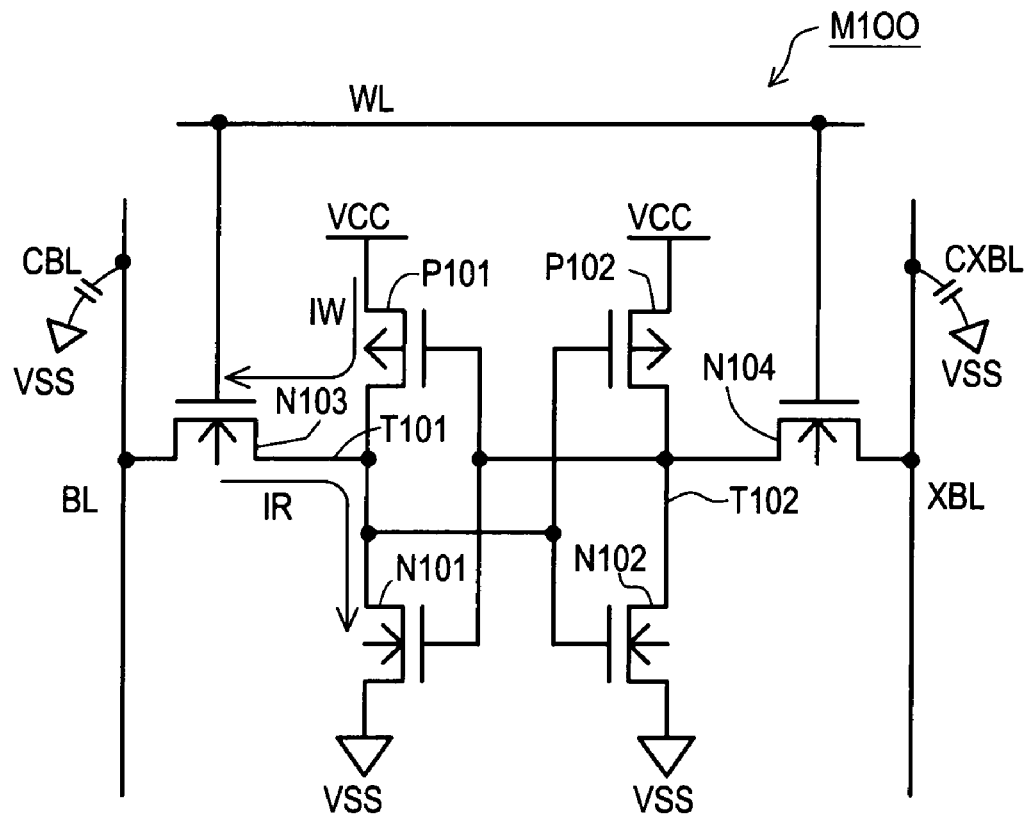
FIG. 14 is a circuit diagram showing a prior-art memory cell.

FIG. 13 is a circuit diagram of a memory cell MH00 as a sixth embodiment. This circuit is the same as that of memory cell M00 as a first embodiment. However, it is different in that this memory cell MH00 is supplied with supply voltage LVCC, instead of supply voltage VCC, which is used in the first embodiment.

For the writing operation, n-type MOS transistors N5 and N6 are controlled to be conductive, and the conductance leading from the bit lines BL and XBL to the inverter is increased, which is the same as the first embodiment. However, in this embodiment, memory cell MH00 in the column that is a target in the writing operation is supplied with the second supply voltage VCC2, which is an electrical potential lower than the supply voltage VCC supplied to the other columns. As a result, in a case where the electrical potential at junction T1 or junction T2 is turned from a high level to a low level, the electrical potential as the low level is easily achieved. Therefore, the writing operation is performed reliably, and this performance is considered more reliable if it is taken together with the effect achieved by the conductive control of n-type MOS transistors N5 and N6.

The present invention is not limited to the above described embodiments, and various refinements and modifications are possible within the scope of and without departing from the present invention.

The present invention may be embodied in other specific forms without departing from the spirit or essential characteristics thereof. For instance, in the first embodiment, n-type MOS transistor N3 (N4) is controlled to be conductive for the reading operation while n-type MOS transistor N3 (N4) and n-type MOS transistor N5 (N6) are controlled to be conductive for the writing operation. In this way, the conductance of the path between the bit line BL (XBL) and the inverter is made larger for the writing operation than for the reading operation. This same effect can be achieved by arranging a first switching element and a second switching element whose conductance is larger than that of the first switching element. In this case, only the first switching element is controlled to be conductive for the reading operation while only the second switching element is controlled to be conductive for the writing operation.

For achieving the same effect, another arrangement may comprise an n-type MOS transistor in replacement of n-type MOS transistor N3 (N4) and n-type MOS transistor N5 (N6), which comprise two switches, in the first embodiment. In this alternative arrangement, the conductance is changed by changing the gate bias voltage of the n-type MOS transistor.

In this specification, n-type MOS transistors N3 and N5 and n-type MOS transistors N3, N5 and N31 are examples of first switching unit while n-type MOS transistors N4 and N6 and n-type MOS transistors N4, N6 and N32 are examples of second switching unit. Furthermore, n-type MOS transistor N11, p-type MOS transistor P11, n-type MOS transistors N41 and N42, p-type MOS transistors P41 and P42 and the n-type MOS transistor whose source is connected to the supply voltage VCC in the supply-voltage switching circuit 7 are examples of power-source switch. Moreover, the n-type MOS transistor whose source is connected to the second supply voltage VCC2 in the supply-voltage switching circuit 7 is an example of second power-source switch. Word lines WL and XWL are examples of first word line while write word lines WWL and XWWL are examples of second word line. Write column lines WCS and XWCS are examples of column line.

The present invention provides a semiconductor memory whose memory cell can maintain a stored content reliably even at a comparatively low source voltage. Moreover, it achieves a semiconductor memory whose memory cell is controlled for reliable writing operation.

What is claimed is:

1. A semiconductor memory comprising a plurality of memory cells, which are disposed in a matrix, and a pair of bit lines, which are disposed for each column of the memory cells;

each of the memory cells comprising:

a pair of inverters, which are cross-coupled and each of whose output terminals is connected through a path to a corresponding one of the bit lines;

a first switching unit, which is provided between one of the bit lines and the output terminal of a corresponding one of the inverters; and a second switching unit, which is provided between the other of the bit lines and the output terminal of the other of the inverters;

wherein:

the first switching unit comprises a first transfer-gate which is conductive during a reading operation and a writing operation and a second transfer-gate which is conductive during the writing operation;

the second switching unit comprises a third transfer-gate which is conductive during the reading operation and the writing operation and a fourth transfer-gate which is conductive during the writing operation; and a conductance of each of the first switching unit and the second switching unit is adjustable, both of the first and second switching units are utilized for the reading operation and the writing operation, and each of the first and second switching units is controlled to be conductive such that the conductance of each switching unit be larger for the writing operation than for the reading operation; and each of the memory cells comprising:

a p-type transistor and an n-type transistor, which are coupled in series between a write column line or a write word line and a ground voltage, gates of which are coupled to a complementary write word line or a complementary write column line respectively, and a coupling point of which is coupled to gates of the second and fourth transfer-gates;

wherein:

the write column line and the write word line are activated in the writing operation, and the complementary write column line and the complementary write word line are complementarily activated to the write column line and the write word line respectively.

2. The semiconductor memory set forth in claim 1, further comprising column lines, which are disposed with respect to the columns of the memory cells and are activated selectively as a result of the column selection, wherein when the column line is activated, each of the first switching unit and the second switching unit is controlled to be conductive such that the conductance of each switching unit be larger for the writing operation than for the reading operation.

3. The semiconductor memory set forth in claim 1, further comprising first word lines, which are disposed with respect to the rows of the memory cells and are activated selectively as a result of a row selection in the reading operation or the writing operation, and second word lines, which are disposed with respect to the rows of the memory cells and are activated selectively as a result of a row selection in the writing operation, wherein each of the first switching unit and the second switching unit includes a first word-line switch, which turns conductive in response to the activation of a first word line, and a second word-line switch, which turns conductive in response to the activation of a second word line.

4. A method for controlling a semiconductor memory that comprises a plurality of memory cells, which are disposed in a matrix, and a pair of bit lines, which are disposed for each column of the memory cells, each of the memory cells comprising a pair of inverters, which are cross-coupled and each of whose output terminals is connected through a path to a corresponding one of the bit lines, a first switching unit, which is provided between one of the bit lines and the output terminal of a corresponding one of the inverters, and a second switching unit, which is provided between the other of the bit lines and the output terminal of the other of the inverters;

wherein:

the first switching unit comprises a first transfer-gate which is conductive during a reading operation and a writing operation and a second transfer-gate which is conductive during the writing operation;

the second switching unit comprises a third transfer-gate which is conductive during the reading operation and the writing operation and a fourth transfer-gate which is conductive during the writing operation; and the semiconductor memory comprises a p-type transistor and an n-type transistor, which are coupled in series between a write column line or a write word line and a ground voltage, gates of which are coupled to a complementary write word line or a complementary write column line respectively, and a coupling point of which is coupled to gates of the second and fourth transfer-gates; and the method comprises:

making the path between each of the bit lines and the output terminal of a corresponding one of the inverters conductive at a first conductance of each of the first switching unit and the second switching unit for the reading operation;

making the path between each of the bit lines and the output terminal of a corresponding one of the inverters conductive at a second conductance of each of the first switching unit and the second switching unit for the writing operation, the second conductance being higher than the first conductance; and wherein:

making the second and fourth transfer-gates added to the first and third transfer-gates conductive as the second conductance by the write column line or the write word line activated and the complementary write word line or the complementary write column line inactivated respectively in the writing operation.

5. The method set forth in claim 4, wherein:

the semiconductor memory comprises column lines, which are disposed with respect to the columns of the memory cells and are activated selectively as a result of the column selection; and the making the respective paths conductive at the second conductance is executed for the writing operation when the column line is activated.

6. The method set forth in claim 4, wherein:

the semiconductor memory comprises first word lines, which are disposed with respect to the rows of the memory cells and are activated selectively as a result of a row selection in the reading operation or the writing operation, and second word lines, which are disposed with respect to the rows of the memory cells and are activated selectively as a result of a row selection in the writing operation;

the making the respective paths conductive at the first conductance is making conductive the path between each of the bit lines and the output terminal of a corresponding one of the inverters in response to the activation of the first word line; and the making the respective paths conductive at the second conductance is making conductive the path between each of the bit lines and the output terminal of a corresponding one of the inverters in response to the activation of the first word line and making conductive the path between each of the bit lines and the output terminal of a corresponding one of the inverters in response to the activation of the second word line.

7. A semiconductor memory comprising a plurality of memory cells, which are disposed in a matrix, and a pair of bit lines, which are disposed for each column of the memory cells;
   each of the memory cells comprising:
   a pair of inverters, which are cross-coupled and each of whose output terminals is connected through a path to a corresponding one of the bit lines;
   a first switching unit, which is provided between one of the bit lines and the output terminal of a corresponding one of the inverters; and
   a second switching unit, which is provided between the other of the bit lines and the output terminal of the other of the inverters;
   wherein:
   the first switching unit comprises a first transfer-gate which is conductive during a reading operation and a writing operation, a first word selection transfer-gate which is conductive based on word selection during the writing operation and a first column selection transfer-gate coupled to the first word selection transfer-gate in series which is conductive based on column selection during the writing operation;
   the second switching unit comprises a third transfer-gate which is conductive during the reading operation and the writing operation, a second word selection transfer-gate which is conductive based on word selection during the writing operation and a second column selection transfer-gate coupled to the second word selection transfer-gate in series which is conductive based on column selection during the writing operation; and
   a conductance of each of the first switching unit and the second switching unit is adjustable, both of the first and second switching units are utilized for the reading operation and the writing operation, and each of the first and second switching units is controlled to be conductive such that the conductance of each switching unit be larger for the writing operation than for the reading operation.

8. A method for controlling a semiconductor memory that comprises a plurality of memory cells, which are disposed in a matrix, and a pair of bit lines, which are disposed for each column of the memory cells, each of the memory cells comprising a pair of inverters, which are cross-coupled and each of whose output terminals is connected through a path to a corresponding one of the bit lines, a first switching unit, which is provided between one of the bit lines and the output terminal of a corresponding one of the inverters, and a second switching unit, which is provided between the other of the bit lines and the output terminal of the other of the inverters;
   wherein:
   the first switching unit comprises a first transfer-gate which is conductive during a reading operation and a writing operation, a first word selection transfer-gate which is conductive based on word selection during the writing operation and a first column selection transfer-gate coupled to the first word selection transfer-gate in series which is conductive based on column selection during the writing operation;
   the second switching unit comprises a third transfer-gate which is conductive during the reading operation and the writing operation, a second word selection transfer-gate which is conductive based on word selection during the writing operation and a second column selection transfer-gate coupled to the second word selection transfer-gate in series which is conductive based on column selection during the writing operation; and
   the method comprises:
   making the path between each of the bit lines and the output terminal of a corresponding one of the inverters conductive at a first conductance of each of the first switching unit and the second switching unit for the reading operation; and
   making the path between each of the bit lines and the output terminal of a corresponding one of the inverters conductive at a second conductance of each of the first switching unit and the second switching unit for the writing operation, the second conductance being higher than the first conductance.

* * * * *